United States Patent
Lichtenberger

(10) Patent No.: US 8,294,271 B2
(45) Date of Patent: Oct. 23, 2012

(54) GOLD-TIN-INDIUM SOLDER FOR PROCESSING COMPATIBILITY WITH LEAD-FREE TIN-BASED SOLDER

(75) Inventor: Heiner Lichtenberger, Williamsville, NY (US)

(73) Assignee: Materion Advanced Materials Technologies and Services Inc., Buffalo, NY (US)

( * ) Notice: Subject to any disclaimer, the term of this patent is extended or adjusted under 35 U.S.C. 154(b) by 24 days.

(21) Appl. No.: 12/996,825

(22) PCT Filed: Jun. 18, 2009

(86) PCT No.: PCT/US2009/047748
§ 371 (c)(1),
(2), (4) Date: Apr. 6, 2011

(87) PCT Pub. No.: WO2010/008752
PCT Pub. Date: Jan. 21, 2010

(65) Prior Publication Data
US 2011/0180929 A1    Jul. 28, 2011

Related U.S. Application Data

(60) Provisional application No. 61/074,771, filed on Jun. 23, 2008.

(51) Int. Cl.
*H01L 23/48* (2006.01)
(52) U.S. Cl. ........ 257/772; 257/779; 257/E21.509; 257/E23.023; 438/121; 420/507
(58) Field of Classification Search .......... 257/772, 257/779, E21.509, E23.023; 438/121; 420/507
See application file for complete search history.

(56) References Cited

U.S. PATENT DOCUMENTS

| 3,181,935 | A |   | 5/1965 | Coad |
| 4,492,842 | A | * | 1/1985 | Koopman et al. ........ 219/85.22 |
| 5,242,658 | A | * | 9/1993 | Stevens et al. ........... 420/557 |
| 7,750,475 | B2 | * | 7/2010 | Souma et al. ............. 257/772 |

FOREIGN PATENT DOCUMENTS

| EP | 0134532 |   | 3/1985 |
| EP | 1433564 |   | 6/2004 |
| GB | 894622 |   | 4/1962 |
| GB | 985282 |   | 3/1965 |
| JP | 56084432 |   | 7/1981 |
| JP | 63-168293 | * | 7/1988 |
| JP | 10233411 |   | 9/1998 |
| JP | 2008137018 |   | 6/2008 |
| WO | WO2005108283 |   | 11/2005 |

OTHER PUBLICATIONS

Singapore Patent Office; Written Opinion in Application No. 201009272-4; Mar. 19, 2012.

* cited by examiner

*Primary Examiner* — Jasmine Clark
(74) *Attorney, Agent, or Firm* — Hiscock & Barclay, LLP

(57) ABSTRACT

Disclosed in this specification is a lead-free soldering alloy made of gold, tin and indium. The tin is present in a concentration of 17.5% to 20.5%, the indium is present in a concentration of 2.0% to 6.0% and the balance is gold and the alloy has a melting point between 290° C. and 340° C. and preferably between 300° C. and 340° C. The soldering alloy is particularly useful for hermetically sealing semiconductor devices since the melting temperature is sufficiently high to permit post-seal heating and sufficiently low to allow sealing of the semiconductor without causing damage.

14 Claims, No Drawings

GOLD-TIN-INDIUM SOLDER FOR PROCESSING COMPATIBILITY WITH LEAD-FREE TIN-BASED SOLDER

FIELD OF THE INVENTION

This invention relates to a new lead-free solder for hermetically sealing semiconductor and specialty devices. The sealing solder has a melting temperature between 290° C. and 340° C. and more preferably between 300° C. and 340° C. Advantageously, such a sealed device may be subsequently soldered with high melting solders without disrupting the integrity of the seal.

BACKGROUND OF THE INVENTION

Currently, semiconductor devices are hermetically sealed using gold-tin (Au—Sn) solder with gold concentrations ranging from 78% to 81% and tin concentrations ranging from 19% to 22%. This solder has been in use in semiconductor devices for more than 40 years and has a melting temperature of 280° C. See U.S. Pat. No. 4,492,842 to Koopman. Semiconductor devices and a myriad of other electronic devices are subsequently soldered onto a printed circuit board using tin-lead solders as a post-sealing solder with melting temperatures of 183° C. to 195° C. The process temperature of these post-sealing solders is typically 35° C. to 50° C. above the melting temperature (i.e. 218° C. to 245° C.). Superheat is required to flow solder onto the leads of the semiconductor device and the copper circuitry of the printed circuit board. Processing the semiconductor devices at temperatures up to 245° C. poses no problem since the gold-tin sealing solder will not re-melt until 280° C.

The prior art lead-free solders that are replacing the tin-lead solders melt at 217° C. and require processing temperatures approaching 270° C. These processing temperatures are dangerously close to the 280° C. melting temperature of the Au—Sn solder used to seal the device. One option is to abandon the tin-based solders and use lead-based solders that contain about 85% lead. Such lead solders have a melting point of about 300° C. The use of lead-based solders is, however, generally avoided by the electronics industry.

As lead continues to be removed from consumer electronics, the need grows for a higher temperature solder to be developed for semiconductor die attach and hermetic sealing of these semiconductor devices. There is a need to replace conventional Au—Sn and lead-based solders with a lead-free, high temperature solder. This need is met by the lead-free alloys of the present invention, whose melting temperature and hermetic sealing capabilities make them especially suitable for use as semiconductor die attach solder and as a hermetic sealing solder for semiconductor devices.

SUMMARY OF THE INVENTION

The invention comprises gold solders that are compatible with semiconductor die attach and hermetic sealing of semiconductor packages with melting temperatures greater than 290° C. and more preferably greater than 300° C. In one embodiment, the solder is a Au—Sn-based solder that is doped with indium to increase the melting temperature of Au—Sn solders.

In another aspect of the invention, the indium modified gold-tin-based solder is compatible with known semiconductor die attach methods as well as hermetically sealing these devices at sufficiently high melting temperatures to prevent reflowing of this solder during subsequent lead-free soldering operations at temperatures exceeding 270° C. The invention is further directed to the use of gold-based solders with melting temperatures between 290° C. and 340° C., and more preferably between 300° C. and 340° C., and even more preferably between 300° C. and 320° C., for manufacturing semiconductor devices and semiconductor devices incorporating these solders.

DETAILED DESCRIPTION OF A PREFERRED EMBODIMENT

The lead-free soldering material described in this specification consists essentially of an alloy of gold, tin and indium, wherein the melting point of the alloy is greater than 290° C. and preferably greater than 300° C., and more preferably in the range of 300° C. to 340° C. and even more preferably in the range of 300° C. to 320° C.

It is preferred that the alloy be at least 99.95% pure. The aforementioned alloy includes from 17.5% to 20.5% tin, from 2.0% to 6.0% indium and the balance of the mass being gold and trace impurities. In one embodiment, the soldering material has a tin concentration of about 19.3% and an indium concentration of about 4.5%. Other suitable concentrations are also contemplated. For example, in another embodiment, the tin concentration is in a range from 18.3% to 20.3% and the indium is in a range from 3.5% to 5.5%. Such a soldering material is useful in a variety of fields, but is particularly useful in the semiconductor field.

Semiconductor devices are often hermetically sealed using gold-tin solders which have a melting point of approximately 280° C. Gold-tin solder is applied to the unsealed package. The resulting assembly is heated to a temperature sufficient to cause the solder to reflow. Upon cooling the package is hermetically sealed by such solder. The melting point of the solder used in this seal step must be sufficiently low so as to not damage the semiconductor device itself. Post-sealing operations may be used to attach additional components to the sealed device and such operations typically include subsequent soldering steps. Care must be taken to ensure that the post-sealing solders have a melting point that is compatible with the sealing solder. Thus, there is a critical range of desirable melting points. The melting point of the sealing solder must be (1) sufficiently low so as to hermetically seal the device without damaging it and (2) sufficiently high so as to permit post-sealing heating without breaking seal integrity.

Advantageously, the soldering material described herein satisfies these parameters. The gold-tin-indium soldering material permits post-sealing operations at temperatures greater than 270° C. without reflowing of the soldering material and subsequent loss of seal integrity. A further advantage of the subject soldering material is that its melting point is sufficiently low (less than 340° C. and more preferably less than 320° C.) so as to permit the hermetic sealing of a semiconductor device without damaging such device.

In one process of the invention, the gold-tin-indium solder is applied to a surface of a semiconductor package. The resulting assembly is heated to a temperature sufficient to cause the soldering solder to reflow such that the package is hermetically sealed. Subsequently, the sealed device may be subjected to post-sealing operations that include heating (e.g. post-sealing soldering and the like). Since the sealing solder has a melting point greater than 290° C. and more preferably greater than 300° C., post-seal heating at high temperatures (for example 270° C.) does not cause the sealing solder to reflow, and thus does not break the integrity of the seal.

While the invention has been described with reference to preferred embodiments, it will be understood by those skilled in the art that various changes may be made and equivalents may be substituted for elements thereof to adapt to particular situations without departing from the scope of the invention. Therefore, it is intended that the invention not be limited to the particular embodiments disclosed as the best mode contemplated for carrying out this invention, but that the invention will include all embodiments falling within the scope and spirit of the appended claims.

What is claimed is:

1. A lead-free soldering material consisting essentially of an alloy of gold, tin and indium wherein the tin is present in a concentration of 17.5% to 20.5%, the indium is present in a concentration of 2.0% to 6.0% and the balance is gold and the alloy has a melting point greater than 290° C.

2. The soldering material as recited in claim 1, wherein the alloy has a melting point in the range of 290° C. to 340° C.

3. The soldering material as recited in claim 1, wherein the alloy has a melting point in the range of 290° C. to 320° C.

4. The soldering material as recited in claim 1, wherein the alloy has a melting point in the range of 305° C. to 315° C.

5. The soldering material as recited in claim 3, wherein the tin is present in a concentration of 18.3% to 20.3% and the indium is present in a concentration of 3.5% to 5.5%.

6. The soldering material as recited in claim 3, wherein the tin is present in a concentration of about 19.3% and the indium is present in a concentration of about 4.5%.

7. A method of hermetically sealing a semiconductor package with a lead-free soldering material including the steps of:
applying a soldering material to a surface of a semiconductor package, wherein the soldering material consists essentially of an alloy of gold, tin and indium wherein the tin is present in a concentration of 17.5% to 20.5%, the indium is present in a concentration of 2.0% to 6.0% and the balance is gold and the alloy has a melting point in the range of 290° C. to 320° C.;
heating the soldering material to a temperature sufficient to cause the soldering material to reflow such that the semiconductor package is hermetically sealed.

8. The method as recited in claim 7, further comprising the step of heating a portion of the hermetically sealed semiconductor package to a temperature greater than 270° C. during a post-sealing operation without reflowing the soldering material.

9. A method of mounting a semiconductor device to a surface with a lead-free soldering material including the steps of:
applying a soldering material to a semiconductor device, wherein the soldering material consists essentially of an alloy of gold, tin and indium wherein the tin is present in a concentration of 17.5% to 20.5%, the indium is present in a concentration of 2.0% to 6.0% and the balance is gold and the alloy has a melting point in the range of 290° C. to 320° C.;
disposing the semiconductor device on a surface such that the soldering material contacts both the semiconductor device and the surface;
heating the soldering material to a temperature sufficient to cause the soldering material to reflow;
cooling the soldering material thus mounting the semiconductor device to the surface.

10. The method as recited in claim 9, further comprising the step of heating a portion of the semiconductor device to a temperature greater than 270° C. during a post-mounting operation without reflowing the soldering material.

11. A hermetically sealed semiconductor assembly that includes a semiconductor device hermetically sealed with a soldering material wherein the soldering material consists essentially of an alloy of gold, tin and indium, the tin having a concentration of 17.5% to 20.5%, the indium having a concentration of 2.0% to 6.0% and the balance is gold and the alloy has a melting point in the range of 290° C. to 320° C.

12. A lead-free soldering material consisting essentially of an alloy of gold, tin and indium, the tin having a concentration of 17.5% to 20.5%, the indium having a concentration of 2.0% to 6.0% and the balance is gold and the alloy has a melting point in the range of 290° C. to 320° C.

13. The soldering material as recited in claim 12, wherein the tin is present in a concentration of 18.3% to 20.3% and the indium is present in a concentration of 3.5% to 5.5%.

14. The soldering material as recited in claim 12, wherein the tin is present in a concentration of about 19.3% and the indium is present in a concentration of about 4.5%.

* * * * *